United States Patent [19]

Khorramabadi

[11] Patent Number: 5,162,753
[45] Date of Patent: Nov. 10, 1992

[54] AMPLIFIER ARRANGEMENT FOR USE AS A LINE DRIVER

[75] Inventor: Haideh Khorramabadi, Chatham Township, Morris County, N.J.

[73] Assignee: AT&T Bell Laboratories, Murray Hill, N.J.

[21] Appl. No.: 799,537

[22] Filed: Nov. 27, 1991

[51] Int. Cl.⁵ ............................................... H03F 3/26
[52] U.S. Cl. ..................................... 330/264; 330/265
[58] Field of Search ............... 330/263, 264, 265, 267, 330/269, 277, 311

[56] References Cited

U.S. PATENT DOCUMENTS 4,959,623 9/1990 Khoury .............................. 330/265
4,963,837 10/1990 Dedic .................................. 330/264

OTHER PUBLICATIONS

Ahuja, B. K. et al, "A Programmable CMOS Dual Channel Interface Processor for Telecommunications Applications," *IEEE Journal of Solid-State Circuits,* SC-19 (6), pp. 892-899 (Dec. 1984).

Fisher, J. A. et al., "A High-Performance CMOS Power Amplifier", *IEEE Journal of Solid-State Circuits,* SC-20, pp. 1200-1205 (Dec. 1985).

Khorramabadi, H., "A CMOS Line Driver with 80 dB Linearity for ISDN Applications," *VLSI Symposium, Digest of Technical Papers,* pp. 75-76 (May 1991).

*Primary Examiner*—Steven Mottola
*Attorney, Agent, or Firm*—D. I. Caplan

[57] ABSTRACT

An amplifier arrangement suitable for use as a line driver is built with a Class AB stage connected in parallel with a Class B stage, whereby the output currents of the stages are summed. Each of the Class AB and the Class B stages has an output current device that is connected in a common-source configuration.

In a push-pull configuration of the arrangement, each of a pair of operational amplifiers in the Class AB stage separately drives each of a pair of operational amplifiers in the Class B stage.

6 Claims, 1 Drawing Sheet

AMPLIFIER ARRANGEMENT FOR USE AS A LINE DRIVER

FIELD OF THE INVENTION

This invention relates to amplifier circuit arrangements and more particularly those amplifier circuit arrangements that are useful as line drivers.

BACKGROUND OF THE INVENTION

An important feature of an amplifier arrangement for use as a (transmission) line driver is high output voltage swing while maintaining desirably high linearity. Thus, such an amplifier arrangement requires significant quiescent current output—i.e., significant output current in the absence of input signal—in order to suppress sudden jumps ("kicks") in the output current when the output turns on, such jumps otherwise causing undesirable distortion. Accordingly, Class A or Class AB amplifier operation is indicated for advantageous operation of line to be driven, for such operation supplies the desired quiescent current.

In a paper entitled "A Programmable CMOS Dual Channel Interface Processor for Telecommunications Applications," published in *IEEE Journal of Solid-State Circuits*, SC-19, (6), pp. 892-899 (Dec. 1984), B. K. Ahuja et al. teach a complementary Class AB output buffer arrangement (at p. 895, FIG. 3) in which a double-ended preamplifier drives a negative input terminal of each of a pair of error amplifiers. One of these error amplifiers controls an output p-channel MOS transistor ("PMOS transistor"), and the other controls an output n-channel MOS transistor ("NMOS transistor"). These transistors are connected in series between positive and negative power supply voltages, thereby forming a load device. For the purpose of furnishing negative feedback to the error amplifiers, a node between the output transistors is connected to the positive input terminal of each of the error amplifiers, and this node serves as an output point of the output buffer arrangement.

There is, however, a major shortcoming in the above-described arrangement: the open-loop voltage gain of the error amplifiers of the Class AB arrangement is limited to less than about 8 or 10, in order that the quiescent output current should not undesirably fluctuate in response to random effects (such as random offset voltages). Such a relatively low open-loop gain, however, does not supply the high linearity that is desired for many practical applications unless the output transistors are operated in their saturation regions. However, in such a case (of saturation operation), in order to retain the desirably high linearity, undesirably large output transistor sizes are required—whereby there results undesirably high quiescent power dissipation, unwanted loss of bandwidth due to the large capacitance associated with the output transistors, and a requirement of undesirably large silicon area for these transistors. Moreover, in the absence of applied input signals—i.e., in the quiescent state of the amplifier—a Class AB (or a Class A) amplifier dissipates undesirably large amounts of power.

Another arrangement was taught in a paper by J. A. Fischer, entitled "A High-Performance CMOS Power Amplifier," published in *IEEE Journal of Solid-State Circuits*, SC-20, pp. 1200-1205 (December 1985). In that paper, a conventional common-drain stage was added to the above-described circuit taught by B. K. Ahuja et al., in order to achieve a well-controlled quiescent state. In circuit applications in which linearity is important, a significant main disadvantage of the arrangement taught by J. A. Fischer et al. is an undesirable non-linearity produced by a turning off by the transistors in the common-drain stage midway through voltage swings. This turning off results in an undesirably poor overall linearity, especially for high output voltage swings. It would therefore be desirable to have an amplifier circuit arrangement that mitigates these shortcomings.

SUMMARY OF THE INVENTION

In accordance with the invention, the foregoing problems are mitigated by an amplifier circuit arrangement comprising:

(a) a Class AB amplifier stage having an input operational amplifier (EP1) and an auxiliary output current device (MAB1) that is controlled by the input operational amplifier and that is connected in a common-source configuration, the input operational amplifier having an input terminal connected to the input point;

(b) an essentially Class B amplifier stage having an output operational amplifier (EP2) and having a main output current device (MB1) that is controlled by the output operational amplifier, an input terminal of the output operational amplifier being connected to an output terminal of the input operational amplifier; and (c) means for electrically connecting an output terminal of each of the main and the auxiliary output current devices to the output point of the arrangement.

Advantageously, the main output current device (MB1) is also connected in a common-source configuration. Further, feedback means (Rf1, Rf2) are advantageously provided to supply the input operational amplifier with negative feedback, in order to accommodate the limited common-mode range of the input and output amplifiers, as well as to fix the gain to a constant value during circuit operation.

In this way, the auxiliary output device of the Class AB stage supplies the quiescent current and some output signal current, while a major portion of the output signal current is supplied by the main output device of the Class B stage. By thus combining the Class AB and Class B stages, additional output current is obtained (from the Class B stage) without introducing unwanted additional quiescent current that would undesirably dissipate added power.

Advantageously also, to obtain a desirable push-pull operation of the Class B stage, the main output device is formed by a "main" p-channel MOS (PMOS) and a "main" n-channel (NMOS) transistor connected in series, the gate (control) electrodes of these transistors being separately connected to respective output terminals of a pair of operational amplifiers (EP2, EN2) located in the output Class B stage. Similarly, for push-pull operation of the Class AB stage, the auxiliary output device is formed by an "auxiliary" PMOS and an "auxiliary" NMOS transistor, likewise connected in series, their gate electrodes being separately connected to respective output terminals of another pair of operational amplifiers (EP1, EN1). Advantageously, small offset voltages are built into each of these operational amplifiers of this other pair (resulting in slightly Class C operation—i.e., current flows for slightly less than half each signal cycle, thus resulting in essentially Class AB operation), in order to turn off both the main NMOS and the main PMOS transistors in the quiescent state of the amplifier arrangement (i.e., in the absence of input signal).

Because the main output device of the Class B stage thus does not contribute either to the quiescent current or to fluctuations in the quiescent current, an amplifier arrangement thus can be built with an open-loop voltage gain (when the arrangement is used in conjunction with a suitable preamplifier) that is high enough to enable the main output transistors to operate in their triode regions. In this way, desirably higher output voltage swings that are desirably linear (and hence also that enable desirably higher power efficiency) has been achieved.

DETAILED DESCRIPTION

Figure 1:
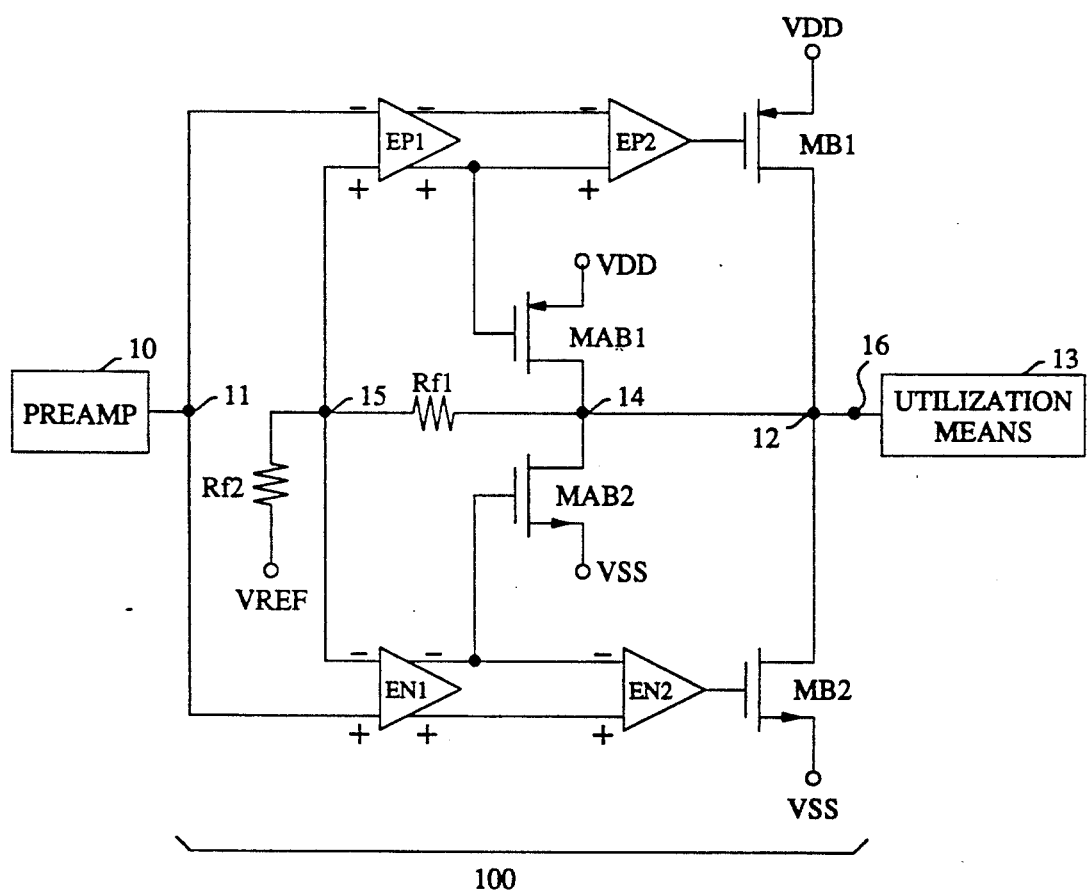
FIG. 1 shows a circuit diagram of an amplifier arrangement in accordance with a specific embodiment of the invention.

Referring now to the drawing, FIG. 1 shows an amplifier arrangement 100 having an input point 11 and an output point 12. An output end of a preamplifier 10 is connected to the input point 11.

During operation, an input voltage signal $V_{in}$ is applied to the input point 11 by the preamplifier 10, whereby an output voltage signal $V_{out}$ is produced at the output point 12. The output point 12 is electrically connected to an input point 16 of a utilization means 13, typically comprising a transmission line to be driven by the amplifier arrangement 100.

The amplifier arrangement 100 includes a pair of input amplifiers EP1 and EN1. Each of these amplifiers has a positive output terminal that separately controls the gate electrode of a pair of series-connected auxiliary output transistors MAB1 and MAB2, respectively. By themselves (in isolation from other circuitry), each of the amplifiers EP1 and EN1 typically is a conventional low-power Class A operational amplifier or an error amplifier.

During operation, each of these amplifiers operates in combination with its respective auxiliary output transistor MAB1 and MAB2 to achieve (push-pull) Class AB operation. Thus the combination of the input amplifiers EP1 and EN1 with the auxiliary output transistors MAB1 and MAB2 forms an input Class AB stage of the amplifier arrangement 100. The transistor MAB1 is PMOS; the transistor MAB2 is NMOS. The high-current paths (source-drain paths) of these transistors are connected in series between power supply voltage terminals VDD and VSS. Typically, the voltages applied to these terminals during operation of the arrangement 100 are +5v and 0v (ground), respectively.

The transistors MAB1 and MAB2 together form an auxiliary output device. More specifically, the source terminal of the auxiliary PMOS transistor MAB1 is connected to a power supply voltage terminal (namely, VDD); hence this transistor MAB1 is connected in a common-source configuration. Moreover, the source terminal of the auxiliary NMOS transistor MAB2 is connected to a power supply voltage terminal (namely, VSS); hence this transistor MAB2 is likewise connected in a common-source configuration.

Each of the input amplifiers EP1 and EN1 has a negative input terminal connected to the input point 11, and has a negative output terminal separately connected to a negative input terminal of a separate one of a pair of output amplifiers EP2 and EN2, respectively. In addition, the positive output terminal of each of the input amplifiers EP1 and EN1 is separately connected to a separate positive input terminal of a respective one of the output amplifiers EP2 and EN2. By themselves (in isolation from other circuitry), each of these output amplifiers EP2 and EN2 typically is a conventional low-power Class A operational amplifier or an error amplifier.

The output amplifiers EP2 and EN2 have output terminals that respectively control the gate electrodes of a main PMOS transistor MB1 and a main NMOS transistor MB2. These main transistors MB1 and MB2 are connected in series between the power supply voltage terminals VDD and VSS, and together these transistors form a main output device. More specifically, the source terminal of the main PMOS transistor MB1 is connected to a power supply voltage terminal (namely, VDD); hence this transistor MB1 is connected in a common-source configuration. Moreover, the source terminal of the main NMOS terminal MB2 is connected to a power supply voltage terminal (namely, VSS); hence this transistor MB2 likewise is connected in a common-source configuration.

A node located between these transistors MB1 and MB2 forms an output terminal of the main device as well as the output point 12 of the amplifier arrangement 100, and this node is connected to a node 14 located between the input transistors MAB1 and MAB2. A positive input terminal of each of the input amplifiers EP1 and EN1 is connected to a common node 15. This node 15 is connected through a resistor Rf1 to the node 14, and this node 14 is connected through another resistor Rf2 to a midway voltage terminal (signal ground, or midway signal point) VREF. Typically, the voltage applied to this midway voltage terminal VREF during operation of the arrangement 100 is approximately +2.5v. Typically, the resistances of resistors Rf1 and Rf2 are both of the order of 1kΩ.

During operation, each of the output amplifiers EP2 and EN2 operates in combination with its respective main output transistor MB1 and MB2, to achieve (push-pull) Class B operation. Thus the combination of the output amplifiers EP2 and EN2 with their respective main output transistors MB1 and MB2 forms a Class B stage of the amplifier arrangement 100.

The purpose of the resistors Rf1 and Rf2 is to provide negative feedback voltage—typically by a fraction in the approximate range between 0.5 and 0.6, such as 0.55—to the input amplifiers EP1 and EN1, in order to accommodate the limited input common-node range of the amplifiers EP1, EN1, EP2 and EN2, as well as to fix the gain to a constant value during circuit operation.

By inspection of FIG. 1 it can be seen that a positive-going signal applied to the input point 11 tends to turn on both MAB1 and MB1, and to turn off both MAB2 and MB2, whereby VDD tends to pull up the voltage at the output point 12. Conversely, a negatively-going signal tends to turn off both MAB1 and MB1, and to turn on both MAB2 and MB2, whereby VSS tends to pull down the voltage at the output point 12. The currents through MAB1 and MB1 add together, because of the parallel connection of these transistors; likewise, the currents through MAB2 and MB2 add together.

Because the auxiliary output device formed by the auxiliary transistors MAB1 and MAB2 contribute only a relatively small portion of the output signal current, these transistors can be made to have relatively small size. Also, the transistors MB1 and MB2 that form the main output device can operate in their triode regions, so as to achieve virtually no loss of linearity, because of the additional gain supplied by the output amplifiers EP2 and EN2 in the Class B stage.

Although the invention has been described in detail in terms of a specific embodiment, various modifications can be made without departing from the scope of the invention. For example, instead of strictly Class B operation, the amplifiers EP2 and EN2 advantageously can have offsets (so as to operate only essentially Class AB, more specifically, slightly Class C—i.e., current flows through each of the main transistors MB1 and MB2 for slightly less than half each signal cycle, typically for at least approximately 45 per cent of the cycle during a pure a-c operation in which a purely sinusoidal signal is applied to the input point 11 of the amplifier arrangement 100), in order to ensure that these amplifiers dissipate virtually no power in the quiescent state.

To achieve balanced output, the preamplifier 10 is constructed as a fully differential (double-ended input, double-ended output) device rather than a single-ended output device (viz., it has two output points)—i.e., with one of its output points connected to the input point 11 of the amplifier arrangement 100 (as shown in FIG. 1), and the other of its output points connected to the input point of another amplifier arrangement (not shown) that is constructed in the same manner as the amplifier arrangement 100. Such a fully differential (balanced) topology is taught—except for the inventive features of the amplifier arrangement 100—in a paper authored by the present inventor H. Khorramabadi, entitled "A CMOS Line Driver With 80dB Linearity for ISDN Applications," published in *VLSI Symposium, Digest of Technical Papers*, pp. 75-76 (May 1991). In that paper, a fully differential (balanced) line-driver topology composed of a balanced output stage fed by a balanced preamplifier, all connected together in a feed-back loop, was described. A prototype line driver utilizing that overall (balanced) topology in 0.9 μm CMOS technology, but having each side of its output stage built in accordance with the amplifier arrangement 100, has been built and tested using the above-mentioned voltages applied to the terminals VDD, VSS, and VREF. It has successfully delivered 9v peak-to-peak-differential output signal at frequencies as high as 40 kHz, with 80 dB linearity.

I claim:

1. An amplifier arrangement having an input point (11) and an output point (12) comprising:
   (a) a Class AB amplifier stage having an input operational amplifier (EP1) and an auxiliary output current device that is controlled by the input operational amplifier and that is connected in a common-source configuration, the input operational amplifier having an input terminal connected to the input point;
   (b) an essentially Class B amplifier stage having an output operational amplifier (EP2) and having a main output current device that is controlled by the output operational amplifier, an input terminal of the output operational amplifier being connected to an output terminal of the input operational amplifier; and
   (c) means for electrically connecting an output terminal of each of the main and the auxiliary output current devices to the output point of the arrangement.

2. The arrangement of claim 1 further comprising:
   first feedback means (Rf1) for connecting an output terminal of the auxiliary output current device to an input terminal of the input operational amplifier.

3. The arrangement of claim 1 or 2 further comprising:
   second feedback means (Rf2) for connecting the input terminal of the input operational amplifier to a reference voltage terminal (VREF).

4. An amplifier arrangement according to claim 1 further comprising another input operational amplifier (EN1), and wherein the auxiliary output device is formed by a first PMOS transistor (MAB1) connected in series with a first NMOS transistor (MAB2), the first PMOS transistor being controlled by the input operational amplifier (EP1), and the first NMOS transistor being controlled by the other input operational amplifier (EN1), the first PMOS transistor being connected in a common-source configuration, and the first NMOS transistor being connected in a common-source configuration.

5. An amplifier arrangement according to claim 1 or 4 further comprising another output operational amplifier (EN2), and wherein the main output device is formed by a second PMOS transistor (MB1) connected in series with a second NMOS transistor (MB2), the second PMOS transistor being controlled by the output operational amplifier (EP2), and the second NMOS transistor being controlled by the other output operational amplifier (EN2), the second PMOS transistor being connected in a common-source configuration, and the second NMOS transistor being connected in a common-source configuration.

6. Electrical circuitry comprising the amplifier arrangement of claim 1 or 2 and a utilization means having an input point (16) connected to the output point (12) of the amplifier arrangement.

* * * * *